(12) United States Patent
Chiang et al.

(10) Patent No.: US 7,781,859 B2
(45) Date of Patent: Aug. 24, 2010

(54) SCHOTTKY DIODE STRUCTURES HAVING DEEP WELLS FOR IMPROVING BREAKDOWN VOLTAGES

(75) Inventors: Puo-Yu Chiang, Suao (TW); Tsai Chun Lin, Hsin-Chu (TW); Chih-Wen (Albert) Yao, Hsin-Chu (TW); David Ho, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/054,224

(22) Filed: Mar. 24, 2008

(65) Prior Publication Data

US 2009/0236679 A1    Sep. 24, 2009

(51) Int. Cl.
*H01L 29/47*    (2006.01)
(52) U.S. Cl. ............... 257/484; 257/477; 257/E29.338; 257/E21.368; 438/570
(58) Field of Classification Search ......... 257/471–486, 257/E29.013, E29.148, E29.338, E21.359, 257/E21.368; 438/534, 570–583
See application file for complete search history.

(56) References Cited

U.S. PATENT DOCUMENTS

| | | | | |
|---|---|---|---|---|
| 5,163,178 A | * | 11/1992 | Gomi et al. | 257/558 |
| 5,338,964 A | * | 8/1994 | Bernier | 257/476 |
| 7,019,377 B2 | * | 3/2006 | Tsuchiko | 257/476 |
| 2004/0099888 A1 | * | 5/2004 | Sriram | 257/288 |
| 2004/0217419 A1 | * | 11/2004 | Rumennik et al. | 257/343 |
| 2006/0001057 A1 | * | 1/2006 | Khemka et al. | 257/280 |
| 2006/0125040 A1 | * | 6/2006 | Levin et al. | 257/471 |
| 2007/0181909 A1 | * | 8/2007 | Rozsypal | 257/109 |
| 2008/0001159 A1 | * | 1/2008 | Ota et al. | 257/77 |

FOREIGN PATENT DOCUMENTS

CN    1855551 A    11/2006
CN    1977389 A    6/2007

* cited by examiner

*Primary Examiner*—Matthew C Landau
*Assistant Examiner*—Aaron Staniszewski
(74) *Attorney, Agent, or Firm*—Slater & Matsil, L.L.P.

(57) ABSTRACT

An integrated circuit structure includes a semiconductor substrate; a well region of a first conductivity type over the semiconductor substrate; a metal-containing layer on the well region, wherein the metal-containing layer and the well region form a Schottky barrier; an isolation region encircling the metal-containing layer; and a deep-well region of a second conductivity type opposite the first conductivity type under the metal-containing layer. The deep-well region has at least a portion vertically overlapping a portion of the metal-containing layer. The deep-well region is vertically spaced apart from the isolation region and the metal-containing layer by the well region.

15 Claims, 8 Drawing Sheets

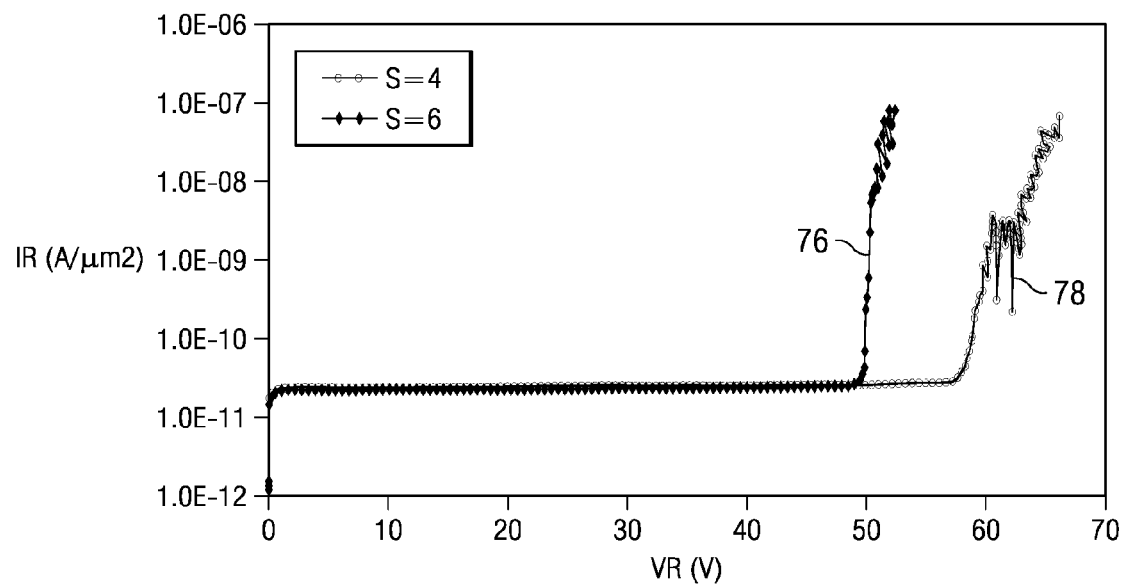
FIG. 12
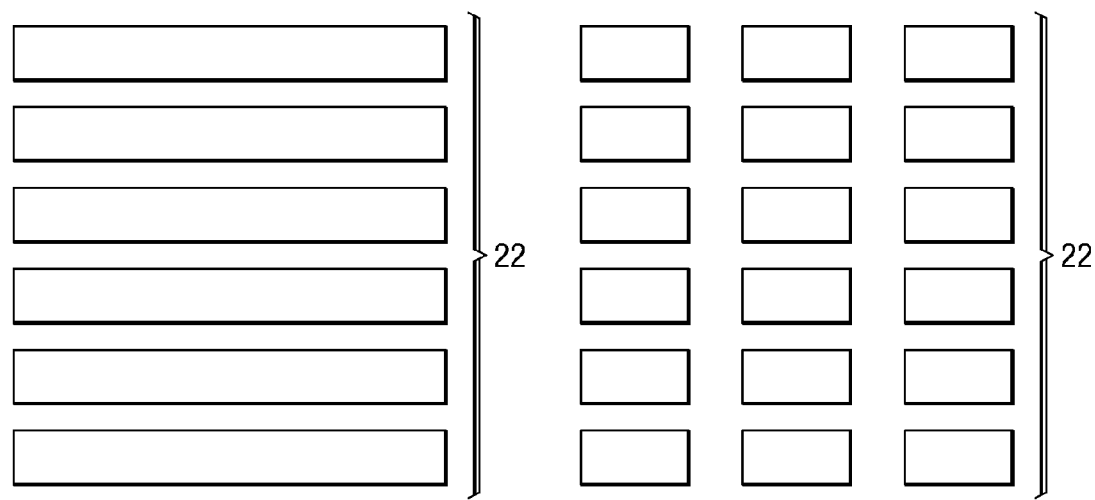
FIG. 13A
FIG. 13B

SCHOTTKY DIODE STRUCTURES HAVING DEEP WELLS FOR IMPROVING BREAKDOWN VOLTAGES

TECHNICAL FIELD

This invention relates generally to semiconductor devices, and more particularly to Schottky diodes with improved breakdown voltages, and methods for forming the same.

BACKGROUND

Schottky diodes are commonly used in applications requiring fast switching, for example, in power circuits. Also, while standard silicon diodes have a forward voltage drop of about 0.6 volts, Schottky diodes' voltage drop at forward biases of around 1 mA is in the range of 0.15 V to 0.45 V, making them useful in voltage clamping applications and in applications for preventing transistor saturation. This is due to the Schottky diode's higher current density.

FIG. 1 illustrates a cross-sectional view of a conventional Schottky diode 100, which includes metal-containing layer 104 formed on an n-type well region 102. Shallow trench isolation regions 106 surround metal-containing layer 104. Metal-containing layer 104 and n-type well region 102 form a Schottky diode, with metal-containing layer 104 acting as an anode, and n-type well region 102 acting as a cathode.

Schottky diode 100 suffers from a low breakdown voltage. FIG. 2 illustrates an I-V curve of Schottky diode 100, wherein the X-axis indicates the reverse voltage VR applied on Schottky diode 100, and the Y-axis indicates the leakage current IR. It is noted that with the increase in the reverse voltage VR, the leakage current IR keeps on increasing. Further, breakdown starts to occur at a reverse voltage of about 20 volts.

FIG. 3 illustrates a cross-sectional view of a modified Schottky diode 200. In addition to the components illustrated in FIG. 1, Schottky diode 200 further includes a p-type ring 122 around edges of metal-containing layer 104. The leakage current of Schottky diode 200 is thus improved over Schottky diode 100. FIG. 4 illustrates an I-V curve of Schottky diode 200, wherein the X-axis again indicates the reverse voltage VR applied on Schottky diode 200, and the Y-axis indicates the leakage current IR. It is noted that the leakage current of Schottky diode 200 is significantly reduced than the leakage current of Schottky diode 100 (refer to FIG. 2). However, the breakdown voltage is still only about 30 volts or less, which is far lower than the ideal breakdown voltage of about 60 voltages. Accordingly, what is needed in the art is a Schottky diode with a low leakage current and a high breakdown voltage.

SUMMARY OF THE INVENTION

In accordance with one aspect of the present invention, an integrated circuit structure includes a semiconductor substrate; a well region of a first conductivity type over the semiconductor substrate; a metal-containing layer on the well region, wherein the metal-containing layer and the well region form a Schottky barrier; an isolation region encircling the metal-containing layer; and a deep-well region of a second conductivity type opposite the first conductivity type under the metal-containing layer. The deep-well region has at least a portion vertically overlapping a portion of the metal-containing layer. The deep-well region is vertically spaced apart from the isolation region and the metal-containing layer by the well region.

In accordance with another aspect of the present invention, an integrated circuit structure includes a semiconductor substrate of a first conductivity type; a well region of a second conductivity type opposite the first conductivity type over the semiconductor substrate; a metal-containing layer over and in contact with the well region; an isolation region forming a ring encircling the metal-containing region; and a deep-well region of the first conductivity type under the well region. The deep-well region includes a first portion overlapping an entirety of the metal-containing layer, and a second portion extending underlying the isolation region.

In accordance with yet another aspect of the present invention, an integrated circuit structure includes a semiconductor substrate of p-type; an n-type well region over the semiconductor substrate; a metal-containing layer on the well region, wherein the metal-containing layer and the well region form a Schottky barrier; a shallow trench isolation (STI) ring encircling and contacting the metal-containing layer; a p-type ring in the n-type well region, wherein the p-type ring overlaps outer portions of the metal-containing layer and inner portions of the STI ring; and a deep n-well region under the metal-containing layer. The deep n-well region has a first portion vertically overlapping a portion of the n-type well region encircled by the p-type ring, and a second portion extending beyond inner edges of the p-type ring. The deep n-well region is vertically spaced apart from the p-type ring by the n-type well region.

The advantageous features of the present invention include improved breakdown voltage, reduced leakage current, and adjustable breakdown voltage.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 illustrates the effect of increasing the width of the STI region; and

FIGS. 13A and 13B are exemplary top views of the deep-well region including separated well regions.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel Schottky diode is provided. The variations of the preferred embodiments are then discussed. Throughout the various views and illustrative embodiments of the present invention, like reference numbers are used to designate like elements.

Figure 1:
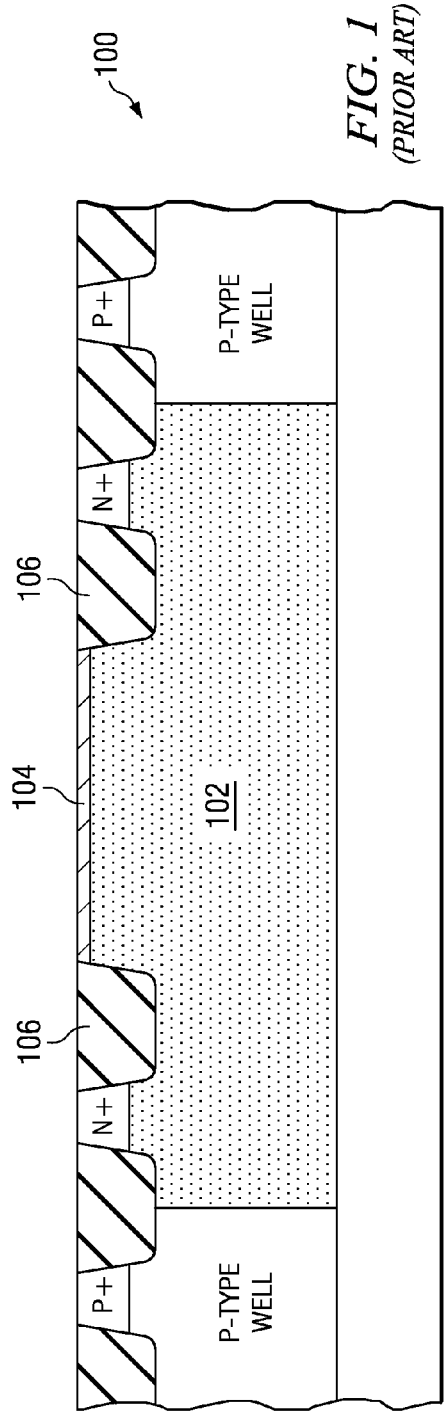
FIG. 1 illustrates a conventional Schottky diode.
Figure 2:
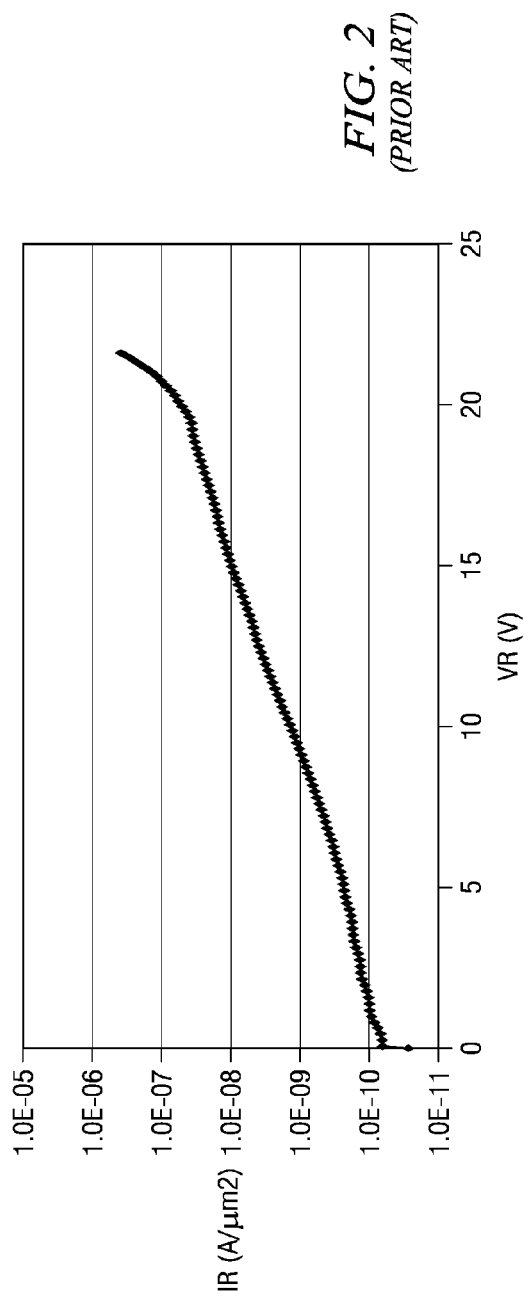
FIG. 2 illustrates an I-V curve of the Schottky diode shown in FIG. 1.
Figure 3:
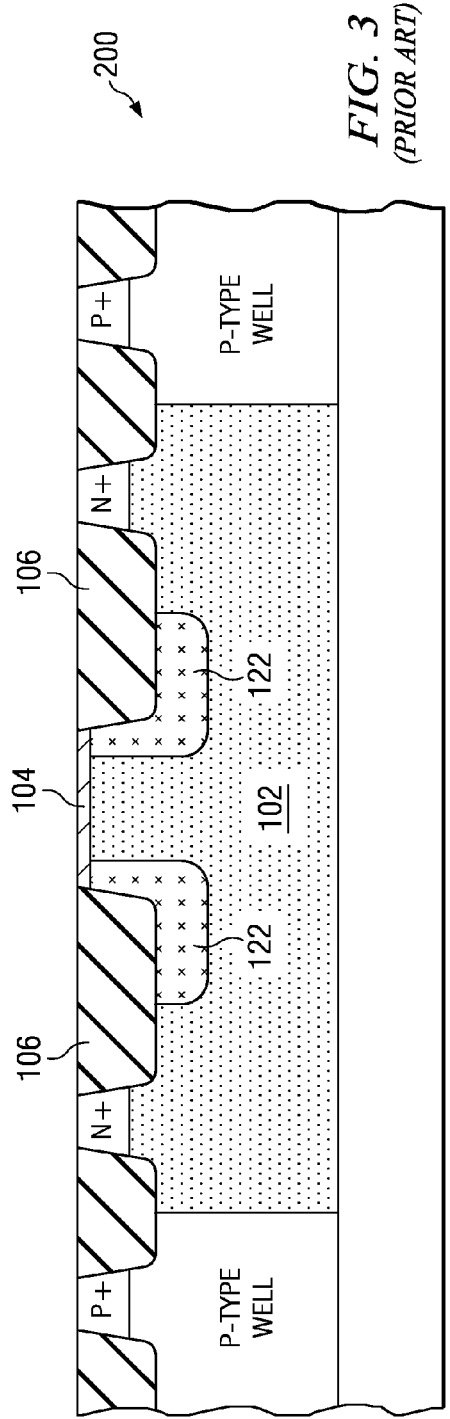
FIG. 3 illustrates a conventional Schottky diode, which includes a p-type ring in addition to the components shown in FIG. 1.
Figure 4:
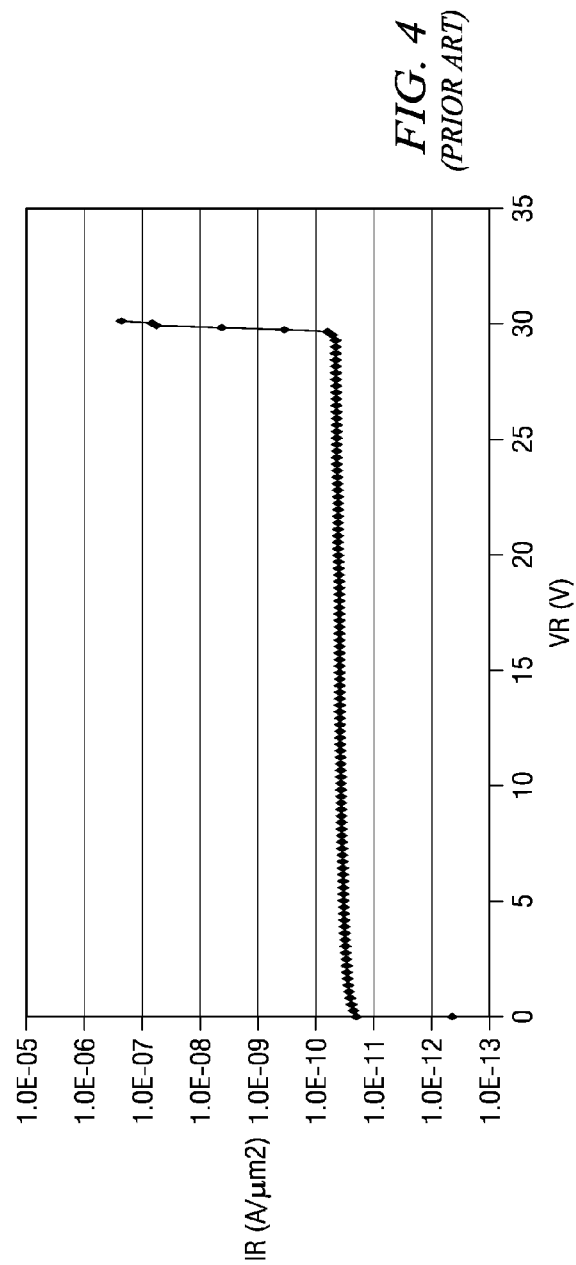
FIG. 4 illustrates an I-V curve of the Schottky diode shown in FIG. 2.
Figure 5:
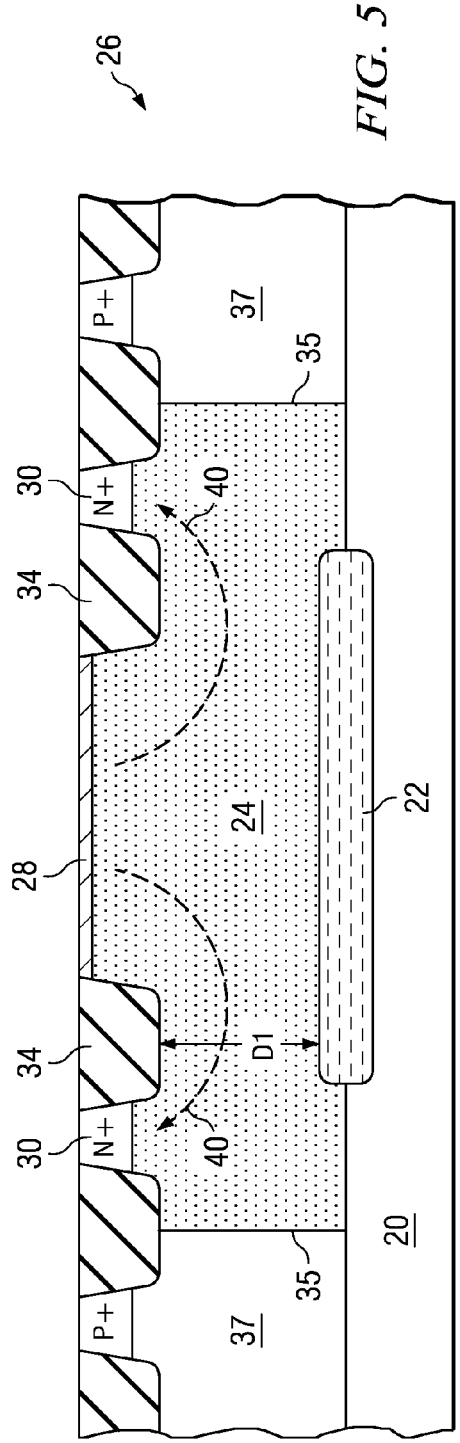
FIG. 5 illustrates an embodiment of the present invention, wherein a Schottky diode includes a deep p-type well region under an n-type well region.

FIG. 5 illustrates a cross-sectional view of a Schottky diode embodiment of the present invention. Substrate 20 is a semiconductor substrate formed of a semiconductor material, for example, silicon or other group III, group IV, and/or group V elements. N-type well region 24, often referred to as high-voltage n-well (HVNW) region 24 for its relatively low impurity concentration, is formed in substrate 20. As is known in the art, n-type well region 24 may be formed by implanting substrate 20 with an n-type impurity, such as phosphorous and/or arsenic. Alternatively, n-type well region 24 may be formed by epitaxially growing a semiconductor layer on substrate 20, and then performing an n-type impurity implantation. In an exemplary embodiment, n-type well region 24 has an impurity concentration of between about $1E15/cm^3$ and about $1E18/cm^3$, although higher or lower impurity concentrations are also applicable.

Schottky diode 26 is formed at the surface of n-type well region 24. Schottky diode 26 includes metal-containing layer 28 on n-type well region 24. Partially due to a relatively low impurity concentration in n-type well region 24, a Schottky barrier is formed between metal-containing layer 28 and n-type well region 24. In the resulting Schottky diode, metal-containing layer 28 is the anode, and n-type well region 24 is the cathode.

In an embodiment, metal-containing layer 28 includes a metal silicide. Alternatively, metal-containing layer 28 may include other materials suitable for forming Schottky barriers, such as pure metals, metal compounds, and the like. In an exemplary embodiment, metal-containing layer 28 includes titanium silicide, although other metal silicides, such as cobalt silicide, tantalum silicide, and combinations thereof, can be used. Metal-containing layer 28 may be formed using a self-aligned silicidation process, which includes selectively forming a metal layer (not shown) on n-type well region 24, and performing an annealing to react the metal with the underlying silicon. Preferably, the metal layer is fully consumed during the silicidation process, although a layer of metal may be left un-reacted after the annealing.

Metal-containing layer 28 is surrounded by, and in physical contact with, isolation region(s) 34. Preferably, isolation region(s) 34 is a shallow trench isolation (STI) region, and hence is referred to as STI region 34 throughout the description. Alternatively, isolation region(s) 34 may be a field oxide region formed, for example, by well-known local oxidation of silicon (LOCOS). STI region 34 forms a ring in a top view, as is shown in FIG. 7B.

Heavily doped n-type (N+) contact region(s) 30 are formed at the surface of n-type well region 24. In the described embodiments, heavily doped means an impurity concentration of greater about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. N+ contact region 30 may also form a ring surrounding STI region 34 in a top view, as is also shown in FIG. 7B.

Schottky diode 26 further includes deep p-well region (DPW) 22 directly underlying metal-containing layer 28. DPW 22 is separated from metal-containing layer 28 by n-type well region 24. Preferably, DPW 22 has a higher impurity concentration than that of n-type well region 24, and may be in an exemplary range of between about $1E16/cm^3$ and about $1E18/cm^3$ The size of DPW 22 is preferably great enough, so that it at least vertically overlaps a third of the width and the length of metal-containing layer 28. More preferably, DPW 22 overlaps an entirety of metal-containing layer 28. In other words, the edges of DPW 22 preferably extends at least under inner portions of STI region 34, or even beyond STI region 34 to under N+ contact region 30. The edges of DPW 22 are preferably spaced apart from the interfaces 35, which are between n-type well region 24 and neighboring p-well regions 37. However, DPW 22 may extend all the way to interfaces 35.

Figure 6:
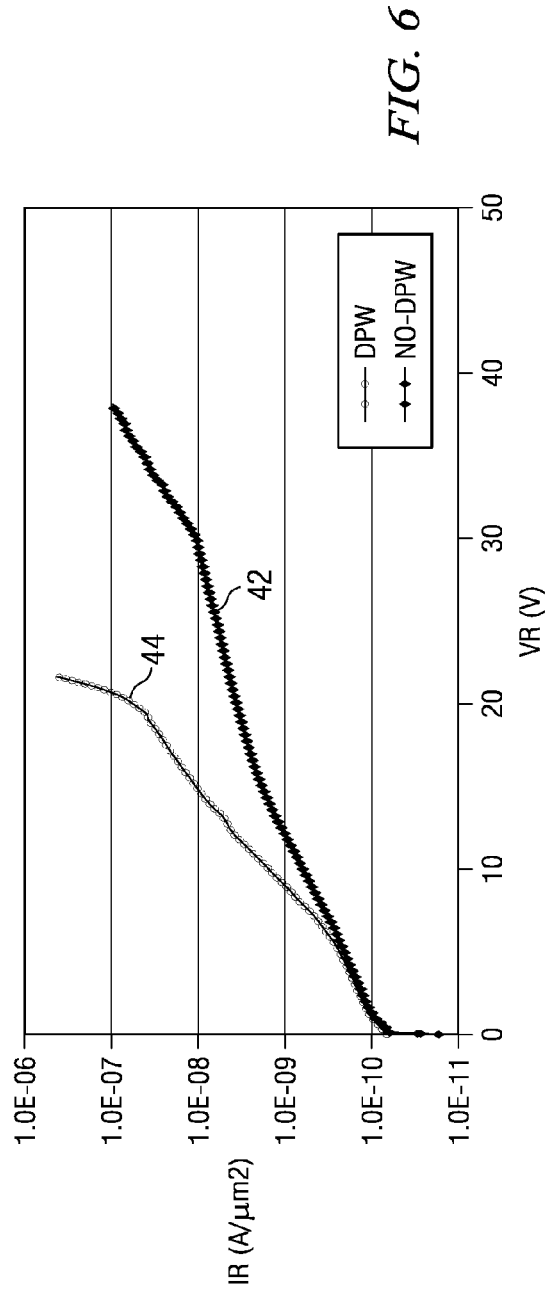
FIG. 6 illustrates an I-V curve of the Schottky diode shown in FIG. 5.

The formation of DPW 22 advantageously reduces the leakage current of Schottky diode 26. FIG. 6 illustrates an I-V curve of Schottky diode 26. The X-axis shows reverse voltages VR applied on Schottky diode 26, and the Y-axis shows the leakage current IR. It is noted that the leakage current (line 42) of Schottky diode 26 is improved over the leakage current (line 44) of a conventional Schottky device, which has a similar structure as Schottky diode 26, except no DPW 22 is formed.

Figure 7A:
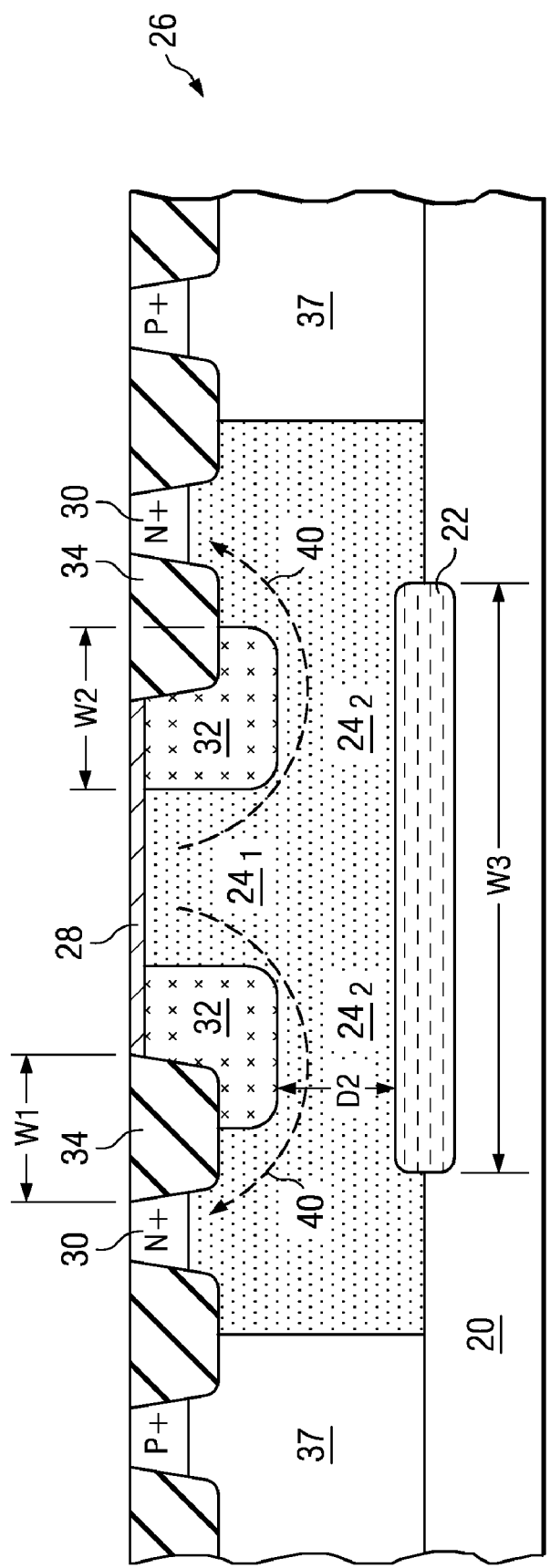
FIGS. 7A and 7B are a cross-sectional view and a top view of a Schottky diode embodiment of the present invention, respectively, which includes a p-type ring and a deep n-type well region.
Figure 7B:
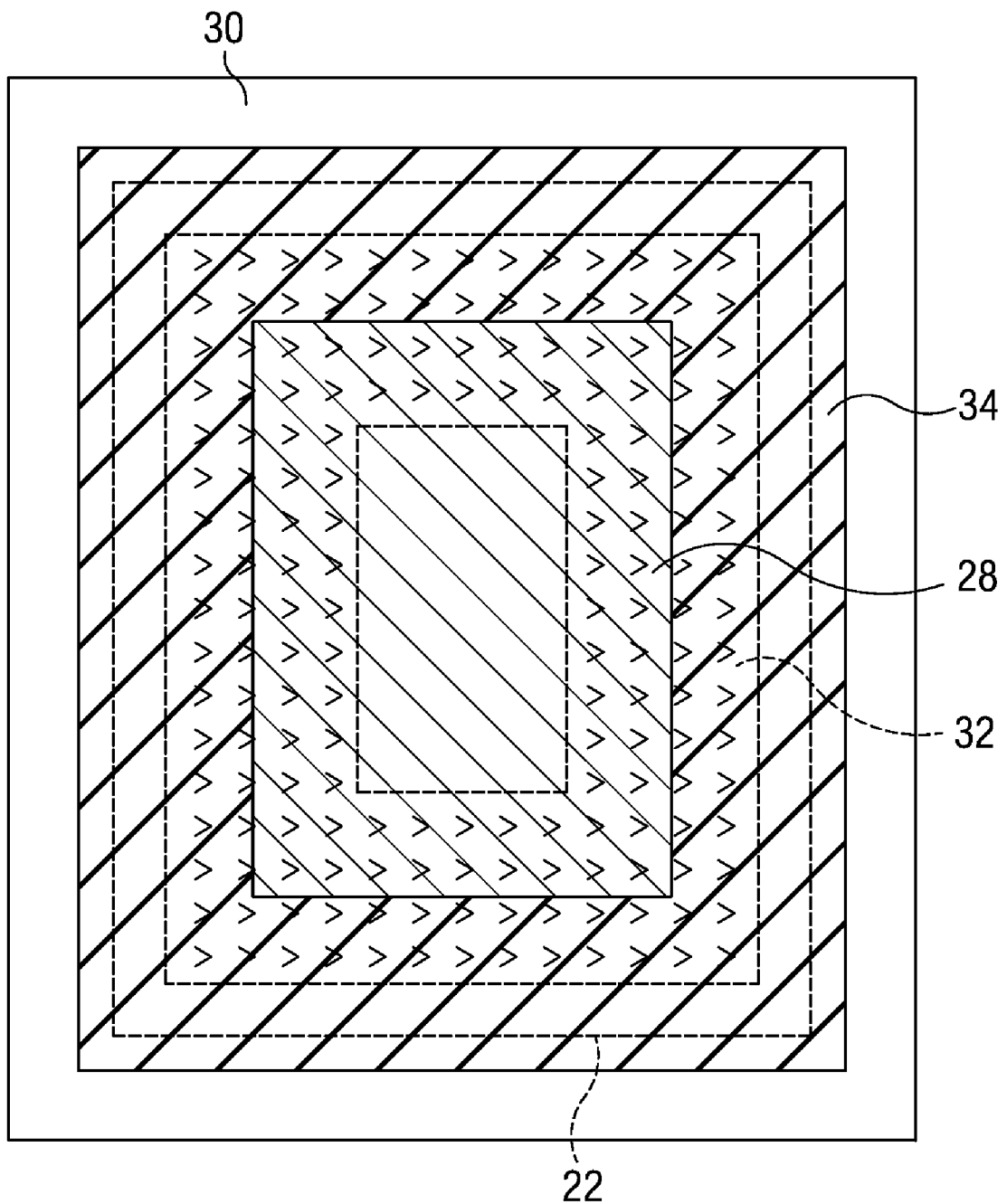

FIG. 7A illustrates an alternative embodiment of the present invention, wherein in addition to the components shown in FIG. 5, Schottky diode 26 further includes p-type region(s) 32. Since p-type region(s) 32 forms a ring (please refer to the top view shown in FIG. 7B), it is also referred to as p-type ring 32 throughout the description. P-type ring 32 preferably contacts metal-containing layer 28, and has portions extending under and overlapping edge portions of metal-containing layer 28. In this embodiment, the size of DPW 22 is preferably great enough so that it at least vertically overlaps inner portions of p-type ring 32. In other words, the edges of DPW 22 preferably extend at least under p-type ring 32, or more preferably beyond the outer edges of p-type ring 32, or even more preferably beyond the outer edges of STI region(s) 34.

The distance D2 between DPW 22 and p-type ring 32 (or the distance D1 between DPW 22 and STI region 34 in FIG. 5) affects the performance of the resulting Schottky diode 26. It is preferred that distances D1 (in FIG. 5) and D2 (in FIG. 7A) are small, so that when a reverse voltage is applied on Schottky diode 26, the resulting depletion region may easily be formed between DPW 22 and p-type ring 32 (or STI region 34) and extends outward toward N+ contact region(s) 30. However, if distances D1 and D2 are too small, when a forward voltage is applied on Schottky diode 26, the forward channel, as shown as arrows 40 in FIGS. 5 and 7A, will be too narrow and will adversely affect the performance of Schottky diode 26. The optimum distances D1 and D2 may be found through experiments. It is expected that distances D1 and D2 are related to the impurity concentrations of DPW 22 and n-type well region 24, and the higher the impurity concentration of DPW 22 (or the lower the impurity concentration of n-type well region 24), the greater the distances D1 and D2 can be. In an exemplary embodiment, distances D1 and D2 may be between about 0.6 μm and about 3 μm.

DPW 22 advantageously extends the length of the depletion region when Schottky diode 26 is applied with a reverse voltage. Without p-type ring 32 and DPW 22, the depletion region will only be between metal-containing layer 28 and n-type well region 24. The formation of p-type ring 32 extends the depletion region down into n-type region $24_1$, which is encircled by p-type ring 32. With the formation of DPW 22, the depletion region may further extend into n-type regions $24_2$, which are between p-type ring 32 and DPW 22.

Figure 8:
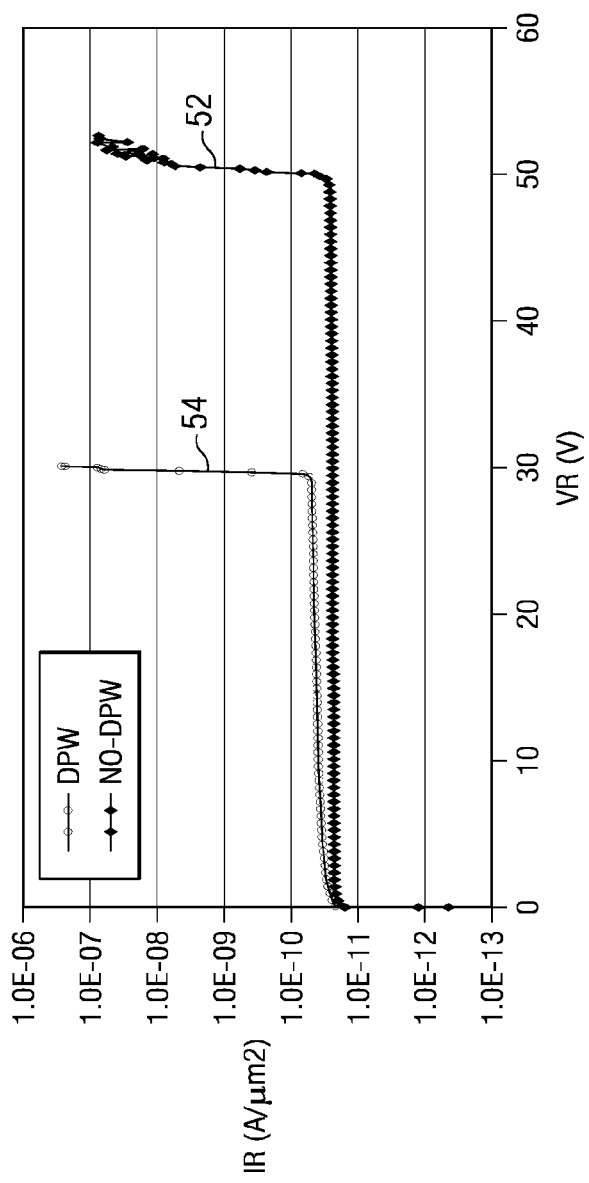
FIG. 8 illustrates an I-V curve of the Schottky diode shown in FIGS. 7A and 7B.

The lengthening of depletion region results in the decrease in the electric field, and hence the increase in the breakdown voltage. FIG. 8 illustrates an I-V curve of Schottky diode 26. It is noted that the breakdown voltage (line 52) of Schottky diode 26 is about 50 volts, which is significantly greater than the breakdown voltage (about 30 volts, line 54) of conventional Schottky devices having a similar structure, except that no DPW 22 is formed.

FIG. 7B schematically illustrates a top view of the structure shown in FIG. 7A. It shows p-type ring 32 and STI region 34 each forming a ring encircling the rectangular metal-containing layer 28. N+ contact region(s) 30 may be formed as a ring, as is shown in FIG. 7B, or as two stripes (not shown) on opposite sides of the STI region 34.

The structures shown in FIGS. 5 and 7A may be formed using various methods. The corresponding process steps are discussed briefly as follows. In a first exemplary embodiment, p-type substrate 20 is provided. DPW 22 is formed by implanting a p-type impurity into substrate 20, wherein a high energy is used to send the impurity into a deep region in substrate 20. In this case, DPW 22 may adjoin both substrate 20 and n-type well region 24, or be formed fully inside n-type region 24, with n-type region 24 including a portion overlying DPW 22, and another portion underlying DPW 22. N-type well region 24, p-well regions 37, and p-type ring 28 are also formed by implantations. Next, STI regions 34 are formed, for example, by etching n-type well region 24 and/or p-well regions 37 to form recesses, and filling the recesses with dielectric material such as oxides. N+ region 30 and P+ regions are also formed using implantations. Metal-containing layer 28 may be formed by a self-aligned silicidation process. At the time metal-containing layer 28 is formed, silicides may also be formed on the top surface of n-type contact region(s) 30.

Figure 9:
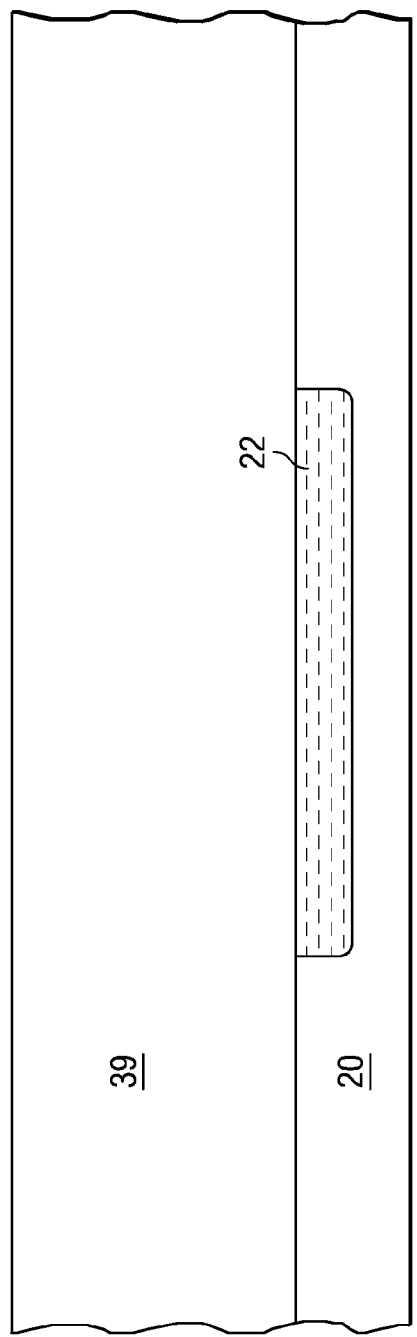
FIGS. 9 and 10 are cross-sectional views of intermediate stages in the formation of the structure shown in FIG. 7A.
Figure 10:
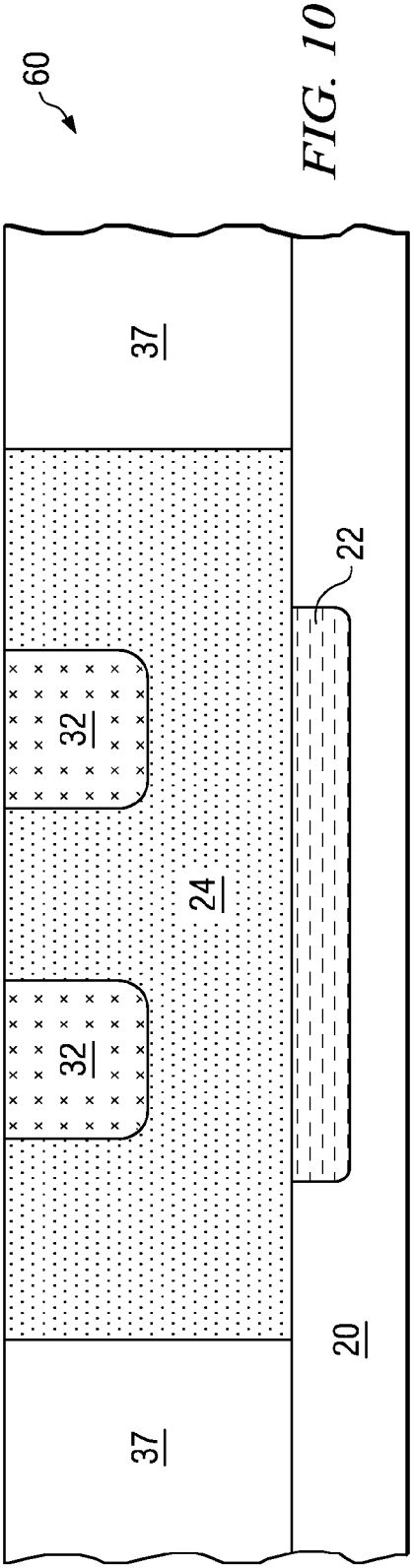

In alternative embodiments for forming the structures shown in FIGS. 5 and 7A, the semiconductor materials over DPW 22 are epitaxially grown. In these embodiments, p-type substrate 20 is first provided. An implantation is performed to introduce a p-type impurity into a surface region of substrate 20, forming DPW 22. As is shown in FIG. 9, an epitaxial growth is then performed to form epitaxial layer 39 on substrate 20 and DPW 22. N-type well region 24 and p-type well regions 37 are then formed in epitaxial layer 39 by implantations. Alternatively, an n-type impurity is doped into epitaxial layer 39 when the epitaxial growth proceeds. A p-type implantation is then performed to convert portions of epitaxial layer 39 into p-type wells 37, while the un-converted portions form n-type wells 24. P-type ring 32 is also formed by an implantation. The resulting structure is shown in FIG. 10. The epitaxial growth of epitaxial layer 39 may also be accompanied by the doping of a p-type impurity. Next, N+ region 30 and P+ regions are formed in the epitaxial layer, and STI regions 34 and metal-containing layer 28 are formed. The resulting structure is shown in FIG. 7A.

Figure 11:
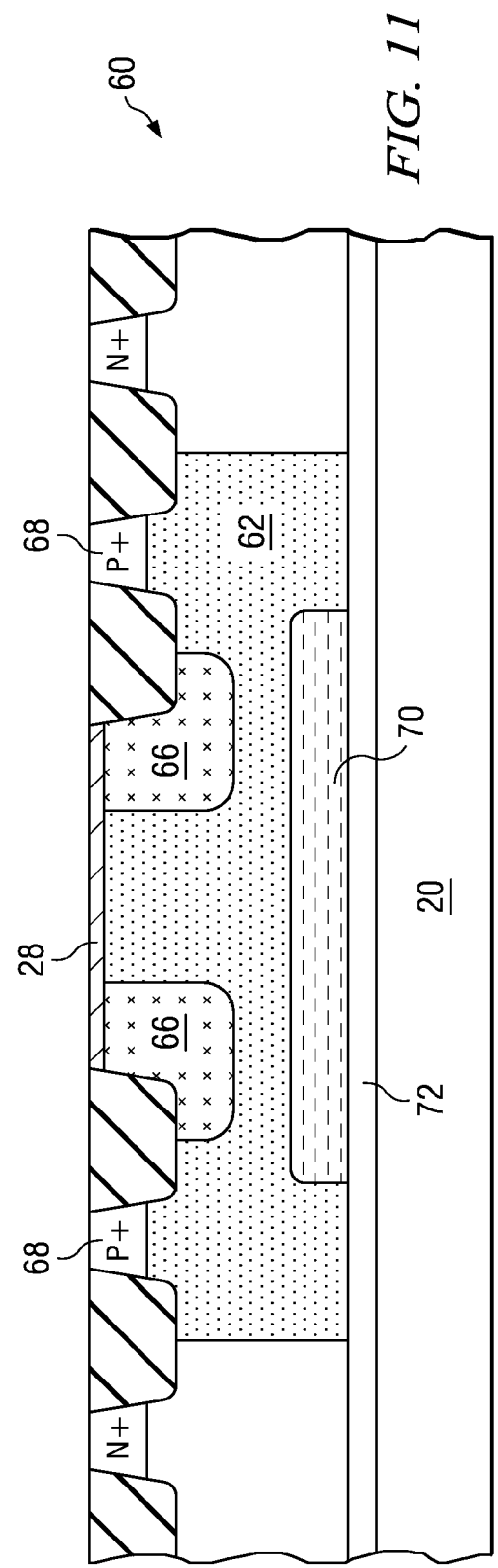
FIG. 11 illustrates an alternative embodiment of the present invention, wherein a Schottky diode includes a metal-containing layer formed on a p-type well region.

FIG. 11 illustrates an alternative embodiment of the present invention, in which Schottky diode 60 includes metal-containing layer 28 being in contact with a p-type well region 62. Schottky diode 60 may further include n-type ring 66, P+ contacts 68, and deep n-type well (DNW) 70. Schottky diode 60 may be formed on an n-type buried layer (NBL) 72, which separates DNW 70 from the p-type substrate 20. Alternatively, Schottky diode 60 may be formed in an n-well (not shown) that is over p-type substrate 20.

An advantageous feature of the embodiments of the present invention is that the breakdown voltages of Schottky diodes can be controlled. Referring back to FIG. 7A, the length (in the direction of arrow 40) of the channel $24_2$ between DPW 22 and p-type ring 32 affects the breakdown voltage, and the longer the channel is, the higher the breakdown voltage. Accordingly, by forming STI regions 34 with a greater width W1, the breakdown voltage can be increased. It is noted that when the width W1 of STI region 34 is increased to improve breakdown voltage, the width W2 of P-type ring 32 and the width W3 of DPW 22 need to be increased accordingly. FIG. 12 illustrates the I-V curves of two embodiments with different widths W1, wherein line 76 is obtained from a sample Schottky diode having width W1 of 4 μm, and line 78 is obtained from a sample Schottky diode having width W1 of 6 μm. In the sample devices, the outer edges of p-type ring 32 extend to the middle of STI region 34. The results revealed the breakdown voltage increased from about 50 volts of line 76 to about 58 volts of line 78. Preferably, width W1 is greater than about 3 μm, and the overlapping regions of DPW 22 and p-type ring 32 have widths greater than about 2 μm.

In the above-discussed embodiments, DPW 22 is illustrated as a continuous region. In alternative embodiments, DPW 22 may have different shapes, and may include various separated (discrete) DPW regions. FIG. 13A illustrates an embodiment wherein DPW 22 is formed of a plurality of DPW strips (in a top view). FIG. 13B illustrates another embodiment wherein DPW 22 is formed of an array of DPW regions. In the exemplary embodiments shown in FIGS. 13A and 13B, the regions between the discrete DPW regions 22 are of n-type, and may be part of the n-type well region 24.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a semiconductor substrate of p-type;
    an n-type well region over the semiconductor substrate;
    a metal-containing layer on the n-type well region, wherein the metal-containing layer and the n-type well region form a Schottky barrier;
    a shallow trench isolation (STI) ring encircling and contacting the metal-containing layer;
    a p-type ring in the n-type well region, wherein the p-type ring overlaps outer portions of the metal-containing layer and inner portions of the STI ring; and a deep p-well region under the metal-containing layer, wherein the deep p-well region comprises a solid p-well plate vertically overlapping an entirety of the metal-containing layer, wherein the n-type well region adjoins the metal-containing layer and the deep p-well region, and wherein the deep p-well region has an impurity concentration higher than impurity concentrations of the semiconductor substrate, the n-type well region, and the p-type ring.

2. The integrated circuit structure of claim 1 further comprising an n-type contact region at a surface of the n-type well region.

3. The integrated circuit structure of claim 1 further comprising a p-type well region over the semiconductor substrate and adjoining the n-type well region, wherein the deep p-well region is horizontally spaced apart from an interface between the p-type well region and the n-type well region.

4. The integrated circuit structure of claim 1, wherein the deep p-well region has an outer edge forming an edge ring, with the edge ring horizontally between a first ring formed of an outer edge of the STI ring and a second ring formed of an inner edge of the STI ring.

5. The integrated circuit structure of claim 1, wherein the solid p-well plate horizontally extends beyond outer edges of the p-type ring.

6. An integrated circuit structure comprising:
a semiconductor substrate of p-type;
an n-type well region over the semiconductor substrate;
a metal-containing layer on the n-type well region, wherein the metal-containing layer and the n-type well region form a Schottky barrier;
a shallow trench isolation (STI) ring encircling and contacting the metal-containing layer;
a p-type ring in the n-type well region, wherein the p-type ring overlaps outer portions of the metal-containing layer and inner portions of the STI ring;
a deep p-well region under the metal-containing layer, wherein the deep p-well region comprises a solid p-well plate vertically overlapping an entirety of the metal-containing layer, and wherein the n-type well region adjoins the metal-containing layer and the deep p-well region; and
a p-type well region over the semiconductor substrate and adjoining the n-type well region, wherein the deep p-well region is horizontally spaced apart from an interface between the p-type well region and the n-type well region.

7. The integrated circuit structure of claim 6, wherein the deep p-well region has an impurity concentration higher than impurity concentrations of the semiconductor substrate, the n-type well region, and the p-type ring.

8. The integrated circuit structure of claim 6 further comprising an n-type contact region at a surface of the n-type well region.

9. The integrated circuit structure of claim 6, wherein the deep p-well region has an outer edge forming an edge ring, with the edge ring horizontally between a first ring formed of an outer edge of the STI ring and a second ring formed of an inner edge of the STI ring.

10. The integrated circuit structure of claim 6, wherein the solid p-well plate horizontally extends beyond outer edges of the p-type ring.

11. An integrated circuit structure comprising:
a semiconductor substrate of p-type;
an n-type well region over the semiconductor substrate;
a metal-containing layer on the n-type well region, wherein the metal-containing layer and the n-type well region form a Schottky barrier;
a shallow trench isolation (STI) ring encircling and contacting the metal-containing layer;
a p-type ring in the n-type well region, wherein the p-type ring overlaps outer portions of the metal-containing layer and inner portions of the STI ring; and
a deep p-well region under the metal-containing layer, wherein the deep p-well region comprises a solid p-well plate vertically overlapping an entirety of the metal-containing layer, wherein the n-type well region adjoins the metal-containing layer and the deep p-well region, and wherein the deep p-well region has an outer edge forming an edge ring, with the edge ring horizontally between a first ring formed of an outer edge of the STI ring and a second ring formed of an inner edge of the STI ring.

12. The integrated circuit structure of claim 11, wherein the deep p-well region has an impurity concentration higher than impurity concentrations of the semiconductor substrate, the n-type well region, and the p-type ring.

13. The integrated circuit structure of claim 11 further comprising an n-type contact region at a surface of the n-type well region.

14. The integrated circuit structure of claim 11 further comprising a p-type well region over the semiconductor substrate and adjoining the n-type well region, wherein the deep p-well region is horizontally spaced apart from an interface between the p-type well region and the n-type well region.

15. The integrated circuit structure of claim 11, wherein the solid p-well plate horizontally extends beyond outer edges of the p-type ring.

* * * * *